United States Patent [19]

Pfiester et al.

[11] Patent Number: 5,021,849
[45] Date of Patent: Jun. 4, 1991

[54] COMPACT SRAM CELL WITH POLYCRYSTALLINE SILICON DIODE LOAD

[75] Inventors: John R. Pfiester; Richard W. Mauntel, both of Austin, Tex.

[73] Assignee: Motorola, Inc., Schaumburg, Ill.

[21] Appl. No.: 428,570

[22] Filed: Oct. 30, 1989

[51] Int. Cl.[5] ............... H01L 29/68; H01L 29/90; H01L 29/04; G11C 11/36
[52] U.S. Cl. .................................... 357/23.5; 357/59; 357/13; 357/71; 357/15; 365/175
[58] Field of Search .................. 357/13, 23.5, 59 A, 357/59 R, 71

[56] References Cited

U.S. PATENT DOCUMENTS

| | | | |
|---|---|---|---|
| 4,654,824 | 3/1987 | Thomas et al. | 365/175 |
| 4,675,715 | 6/1987 | Lepselter et al. | 357/59 |
| 4,804,636 | 2/1989 | Groover, III et al. | 357/42 |
| 4,831,424 | 5/1989 | Yoshida et al. | 357/23.13 |
| 4,903,096 | 2/1990 | Masuoka et al. | 357/23.5 |
| 4,907,052 | 3/1990 | Takada et al. | 357/59 |
| 4,922,455 | 5/1990 | Chin et al. | 365/175 |
| 4,933,735 | 6/1990 | Potash et al. | 357/59 |

FOREIGN PATENT DOCUMENTS 0182610  5/1986  European Pat. Off. ............ 357/59

Primary Examiner—Andrew J. James
Assistant Examiner—Cynthia S. Deal
Attorney, Agent, or Firm—James L. Clingan, Jr.

[57] ABSTRACT

A compact SRAM cell and method for its fabrication are disclosed. The small size of the SRAM cell is achieved by fabricating a diode load immediately above the gate electrode of each of the cross coupled transistors of the cell. In accordance with one embodiment, the gate electrode and diode structure include, in sequence, an N-type doped polycrystalline silicon layer, an electrically conductive diffusion barrier layer, a P-type doped polycrystalline silicon layer and an N-type doped polycrystalline layer.

5 Claims, 4 Drawing Sheets

COMPACT SRAM CELL WITH POLYCRYSTALLINE SILICON DIODE LOAD

BACKGROUND OF THE INVENTION

This invention relates generally to semiconductor devices and to their fabrication, and more specifically to a static RAM having a compact cell employing polycrystalline silicon diodes as load elements and to a process for fabricating the static RAM.

As static random access memories (SRAM) continue to grow in memory size, that is, the number of bits of information that can be stored, it becomes necessary to shrink the size of each individual storage location or cell in that memory and to reduce the power consumed by each storage cell. The use of diodes as load elements is recognized as one way to reduce the power consumed by a storage cell. The diode load also uses less space than do some other load elements. The use of conventional diodes, however, has not succeeded in sufficiently reducing the size of the memory. Accordingly, a need existed for a static RAM cell which would achieve low power and use less space than do previous cell implementations.

It is therefore an object of this invention to provide an improved static random access memory cell.

It is a further object of this invention to provide an improved static random access memory cell using diode loads and having a reduced cell size.

It is a still further object of this invention to provide an improved process for fabricating a compact static RAM.

BRIEF SUMMARY OF THE INVENTION

The foregoing and other objects and advantages of the invention are achieved, in accordance with the invention, by a structure in which polycrystalline silicon diode loads are positioned over the gate electrodes of cross coupled devices in the memory cell. In accordance with one embodiment of the invention, the static RAM cell includes first and second cross coupled MOS transistors each having a gate electrode, a drain, and a source. An electrically conductive diffusion barrier layer overlays each of the gate electrodes, and a diode structure including two oppositely doped polycrystalline silicon layers are formed overlaying the barrier layer. The electrically conductive diffusion barrier layer overlaying the first of the two transistors is coupled to the drain of the second transistor and the electrically conductive diffusion barrier overlaying the second transistor is coupled to the drain of the first transistor.

DETAILED DESCRIPTION OF THE PREFERRED EMBODIMENTS

Figure 1:
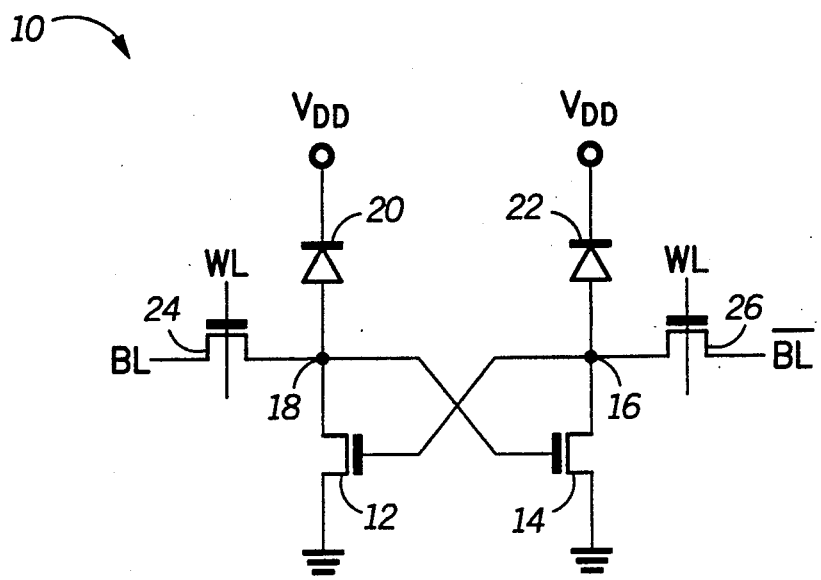
FIG. 1 illustrates schematically a static RAM cell having diode loads.

A conventional static RAM cell 10 employing diode loads is illustrated in FIG. 1. Memory cell 10 includes two cross coupled MOS transistors 12 and 14. The gate electrode of transistor 12 is coupled to the drain of transistor 14 at node 16. Similarly, the gate electrode of transistor 14 is coupled to the drain of transistor 12 at node 18. In series with transistor 12 is diode load 20 and in series with transistor 14 is diode load 22. Diodes 20 and 22 are also coupled to a source of potential, here illustrated to be $V_{DD}$. The sources of transistors 12 and 14 are coupled to a second source of potential, here illustrated to be ground. Node 18 is coupled through transistor 24 to a bit line (BL). Node 16 is coupled through transistor 26 to a complementary bit line ($\overline{BL}$). Each of transistors 24 and 26 is addressed by a word line (WL).

Figure 2:
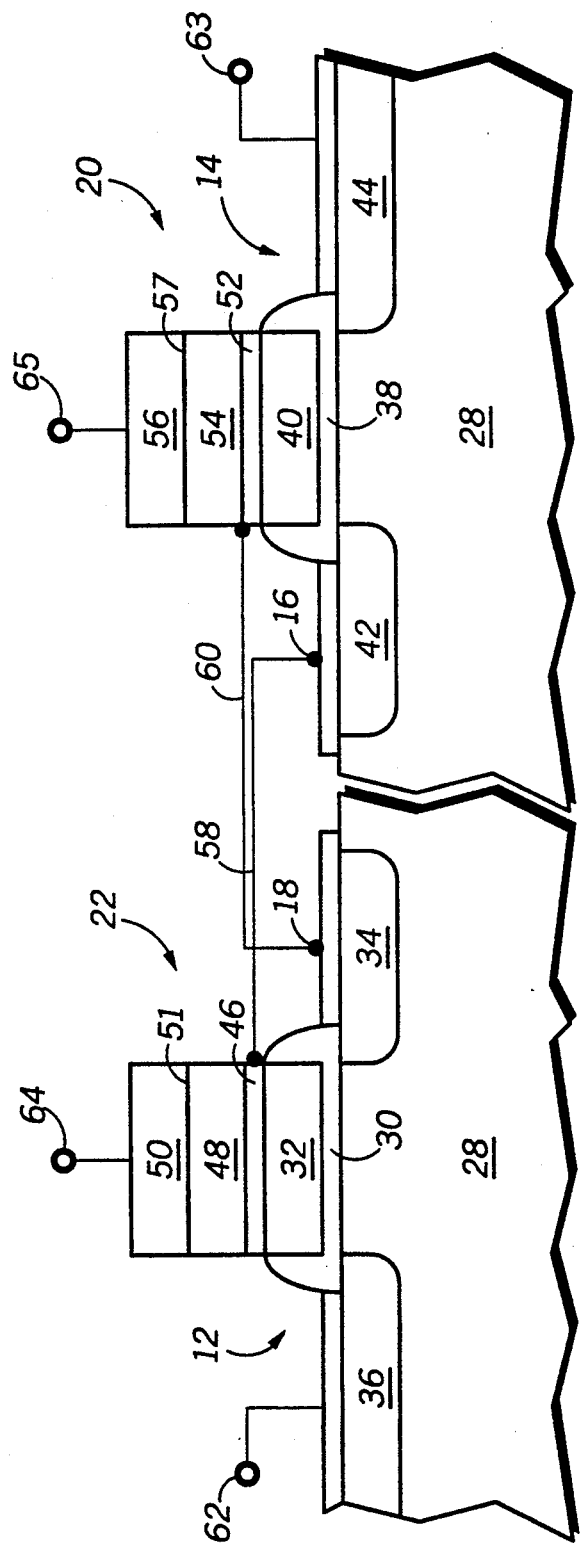
FIG. 2 illustrates schematically, in cross-section, the two cross coupled transistors and the two diode loads of the memory cell of FIG. 1.

Transistors 12 and 14 and diodes 20 and 22 are implemented, in accordance with one embodiment of the invention, as schematically illustrated in FIG. 2. FIG. 2 illustrates the devices in broken cross section. The devices are implemented in a semiconductor substrate 28 such as a P-type silicon substrate. The structure illustrated includes a gate insulator 30 formed on the surface of substrate 28, with a gate electrode 32 overlaying the insulator. A drain region 34 and source region 36 are formed in substrate 28 in alignment with gate electrode 32. Together these elements make up transistor 12. Similarly, gate insulator 38 and overlaying gate electrode 40 together with drain region 42 and source region 44 make up transistor 14. Overlaying gate electrode 32 of transistor 12 is an electrically conductive diffusion barrier layer 46 and two oppositely doped polycrystalline silicon layers 48 and 50. Oppositely doped polycrystalline silicon layers 48 and 50 having a rectifying junction 51 therebetween form diode 22. In similar manner, an electrically conductive diffusion barrier layer 52 overlays gate electrode 40 of transistor 14. Overlaying barrier layer 52 are oppositely doped polycrystalline silicon layers 54 and 56 having a rectifying barrier 57 therebetween. Oppositely doped polycrystalline silicon layers 54 and 56 form diode 20. As schematically illustrated, means 58 are provided for coupling conductive diffusion barrier layer 46 to drain region 42 of transistor 14 at node 16. In similar manner, means 60 are provided for coupling conductive diffusion barrier layer 52 to drain 34 of transistor 12 at node 18. As further illustrated schematically, means 62 and 63 are provided for coupling transistor 12 and 14, respectively, to one source of potential such as ground and means 64 and 65 are provided for coupling diodes 22 and 20, respectively, to a source of potential such as $V_{DD}$.

Figure 3:
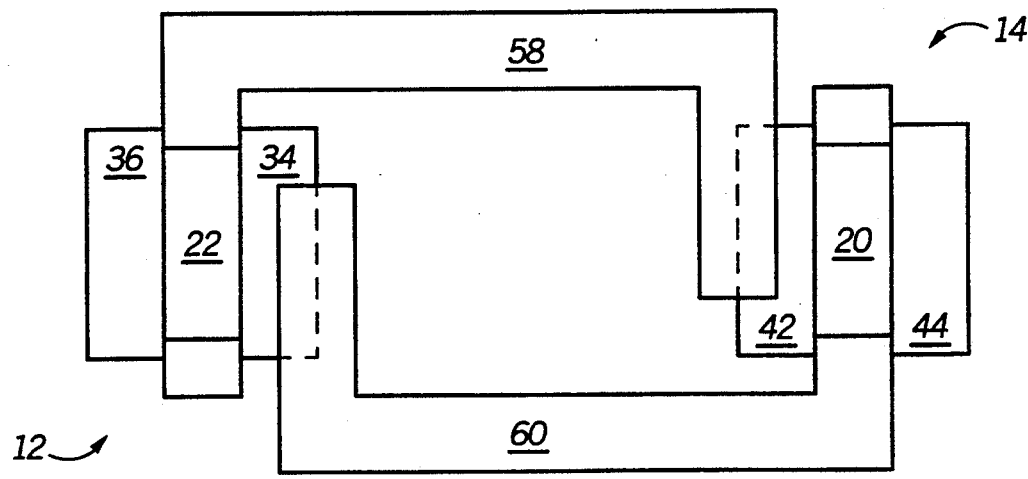
FIG. 3 illustrates, in plan view, one means for laying out the structure of FIG. 2.

FIG. 3 schematically illustrates in plan view one way in which the transistors 12 and 14 and diodes 20 and 22 of FIG. 2 can be interconnected. Interconnections 58 and 60 are routed as shown to couple one end of diode 22 to drain region 42 and one end of diode 20 to drain region 34, respectively.

Figure 4:
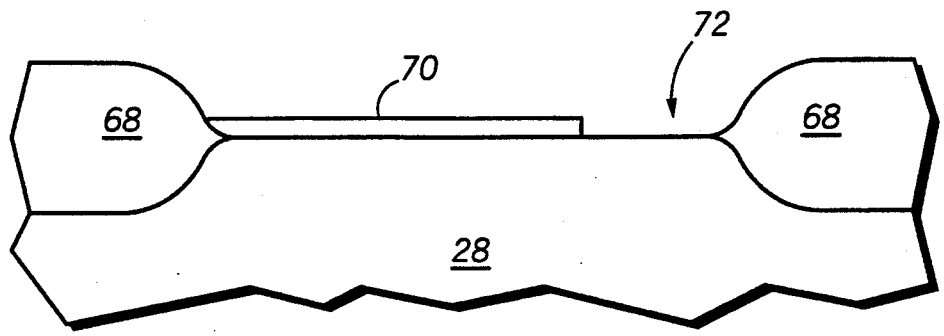
FIGS. 4–7 illustrate, in cross-section, process steps in accordance with one means for implementing the invention.

FIGS. 4–7 illustrate schematically, in cross section, process steps used in the fabrication of a transistor and load diode structure in accordance with the invention. This transistor and diode correspond, for example, to the transistor 12 and diode 22 illustrated in FIG. 2. As illustrated in FIG. 4, the structure includes a semiconductor substrate 28 which is electrically isolated at the surface by thick oxide 68 or other well known isolation means. A gate insulator 70 is formed on the surface of substrate 28 and is patterned to provide an opening 72 through the insulator exposing a portion of substrate 28. The thick field oxide 68, gate insulator 70, and opening 72 are formed in conventional manner. Other process steps, not relevant to the invention as disclosed, may have also been performed on substrate 28.

Figure 5:
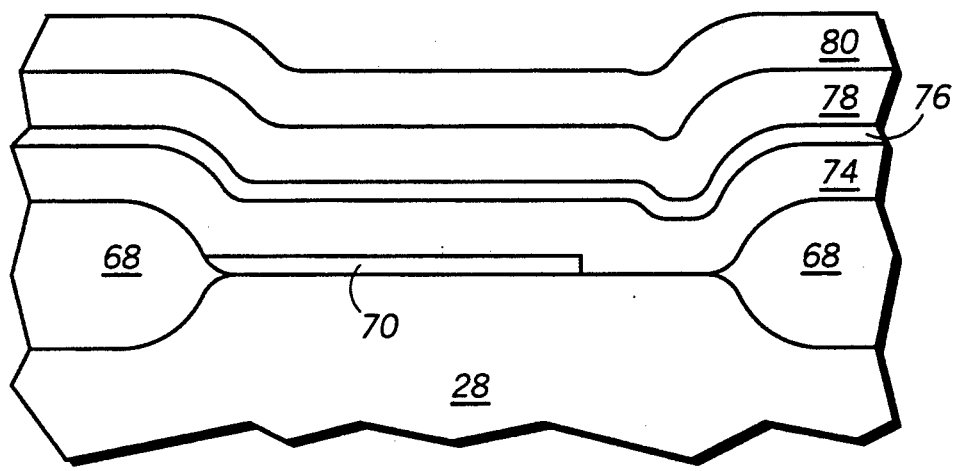

As illustrated in FIG. 5, the process continues, in accordance with the invention, by the sequential deposition of a layer of N-type doped polycrystalline silicon 74, an electrically conductive diffusion barrier layer 76, a layer of P-type doped polycrystalline silicon 78, and a layer of N-type doped polycrystalline silicon 80. Layer 74 will form the gate electrode of the N-channel transistors in the memory array. Polycrystalline silicon layers 78 and 80 will form the diode loads. Layer 76 provides electrical connection between the gate electrode and the diode, but prevents the diffusion of dopant impurities between polycrystalline layers 74 and 78. Diffusion barrier layer 76 should be a metallic compound which has a high etch selectivity to polycrystalline silicon, a low sheet resistance, and is a good diffusion barrier for dopant impurities such as boron, arsenic, and phosphorus. Titanium nitride is a preferred material for diffusion barrier layer 76, but other material such as tungsten and some of the metal silicides can also be used. Polycrystalline silicon layer 74 is heavily doped with N-type impurities and contacts substrate 28 through opening 72. Layer 74 has a thickness of about 350 nanometers. Layers 78 and 80 preferably have thicknesses in the range of 50–100 nanometers. Preferably each of the polycrystalline silicon layers is doped during deposition. If titanium nitride is used for barrier layer 76, the titanium nitride can be deposited by chemical vapor deposition or can be deposited as a titanium layer which is subsequently heated in nitrogen or a nitrogen containing ambient such as ammonia. Heating in the nitrogen bearing ambient causing the formation of titanium silicide at the interface between the titanium metal and polycrystalline silicon layer 74. Continued heating results in the conversion of the remaining titanium to titanium nitride. The titanium layer is nitrided before the deposition of layers 78 and 80.

Figure 6:
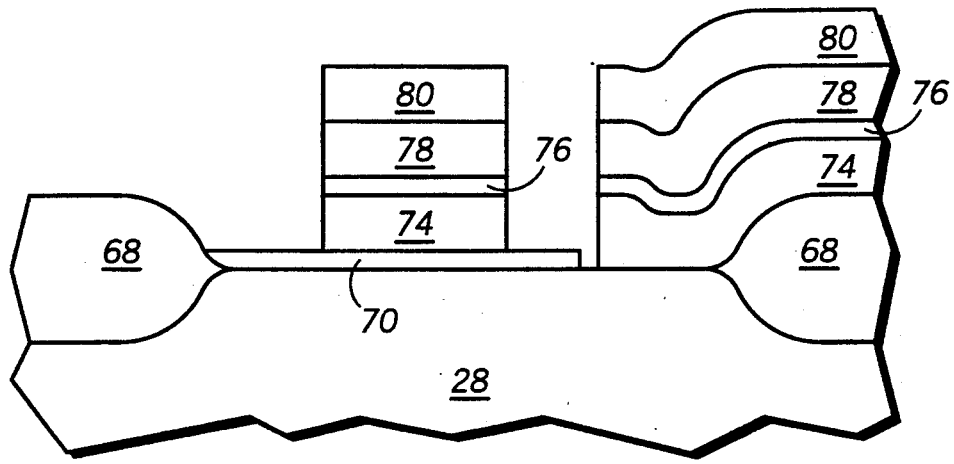

The stacked structure including the three polycrystalline silicon layers and the electrically conductive diffusion barrier layer are selectively patterned as illustrated in FIG. 6. The selective patterning is accomplished using conventional photolithographic techniques.

Figure 7:
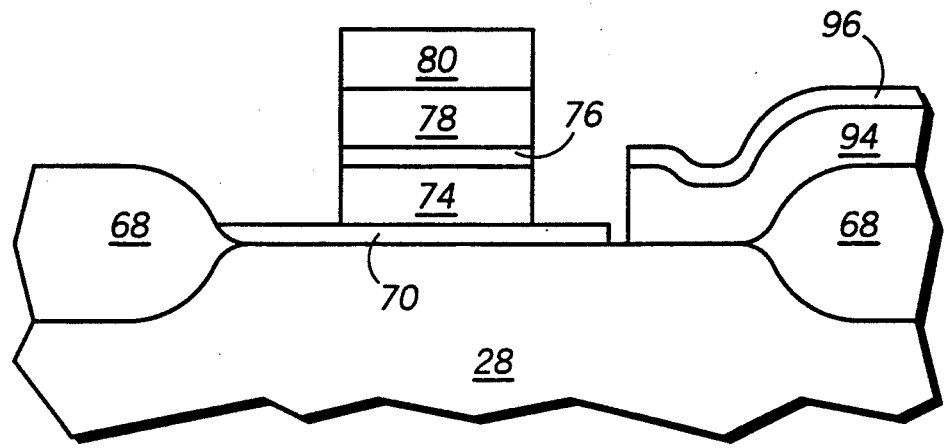

As illustrated in FIG. 7, using an additional photolithographic masking step, upper polycrystalline silicon layers 78 and 80 are again patterned to remove those layers except for the portion located over the gate electrode. Those portions of polycrystalline silicon layer 74 and diffusion barrier layer 76 from which the upper polycrystalline silicon has been removed, now designated as 94 and 96, respectively, provide interconnection between the device illustrated and other devices within the memory cell. Processing then continues, in conventional manner, including the formation of source and drain regions to achieve the device structure as illustrated in FIG. 2. Additional conventional steps are then subsequently used to complete the device including such steps as metallization, passivation, and the like.

Figure 8:
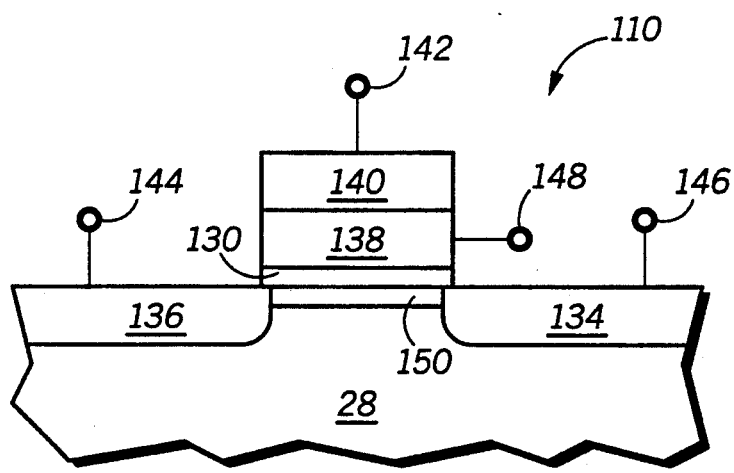
FIG. 8 illustrates, in cross section, a device structure in accordance with a further embodiment of the invention.

FIG. 8 illustrates, in cross section, the essential elements of a device structure 110 in accordance with an alternate embodiment of the invention. Device structure 110 includes a semiconductor substrate 28, a gate insulator 130, a drain region 134, and a source region 136. In addition, the device structure includes a composite gate electrode and diode load formed by a P-type polycrystalline silicon layer 138 and an N-type doped polycrystalline silicon layer 140. Structure 110 provides a diode 22 and a transistor 12 as illustrated in FIG. 1. Contact 142 to polycrystalline silicon layer 140 provides means to couple the diode to a source of potential such as $V_{DD}$. Contact 144 to source region 136 provides means for coupling the source of transistor 12 to a second source of potential such as ground. Contact 146 couples drain 134 of transistor 12 to the gate electrode of an additional transistor cross coupled with transistor 12 to form the static RAM memory cell. Contact 148 provides means to couple the gate of transistor 12 to the drain of the cross coupled transistor. Because polycrystalline silicon layer 138, which forms the gate electrode of the transistor is doped P-type instead of the conventional N-type, ions must be implanted into the channel region of the transistor to adjust the threshold voltage of the transistor. The implanted channel region located in substrate 28 between the source and drain regions is indicated by the region 150.

Thus, it is apparent that there has been provided, in accordance with the invention, an improved static random access memory and a method for its fabrication which fully meets the objections and advantages set forth above. Although the invention has been described and illustrated with reference to specific embodiments thereof, it is not intended to limit the invention to these illustrative embodiments. Those skilled in the art will recognize that variations and modifications can be made without departing from the spirit of the invention. The embodiments disclose only the fabrication of an N-channel transistor, and of course the invention is equally applicable to a P-channel transistor. It is also likely that the devices illustrated will be fabricated as part of a CMOS device structure, and the additional steps necessary for implementing the P-channel transistors are conventional and can be integrated with the above described process. Accordingly, it is intended to include within the invention all such variation and modifications as fall within the scope of the claims.

What is claimed is:

1. A static RAM cell having first and second cross coupled transistors and integral diode loads, the cell comprising:

a semiconductor substrate of first conductivity type having said first and second transistors formed at a surface thereof, each of said first and second transistors having spaced apart source and drain regions of second conductivity type formed in said substrate and separated by a channel region, a gate insulator overlaying said channel region, and a silicon gate electrode of second conductivity type overlaying said gate insulator;

an electrically conductive diffusion barrier overlaying and electrically contacting said silicon gate electrodes;

a diode load structure electrically coupled to each of said first and second transistors, each of said diode load structures comprising a first silicon layer of first conductivity type overlaying and electrically contacting said conductive diffusion barrier and a second silicon layer of second conductivity type overlaying said first silicon layer and having a rectifying junction between said first and second silicon layers;

an electrical interconnection coupling said electrically conductive diffusion barrier overlaying said gate electrode of said first transistor to said drain region of said second transistor; and a second electrical interconnection coupling said electrically conductive diffusion barrier overlaying said gate electrode of said second transistor to said drain region of said first transistor.

2. The static RAM cell of claim 1 wherein said electrically conductive diffusion barrier comprises titanium nitride.

3. The static RAM cell of claim 1 further comprising an electrical contact to said second silicon layer of each of said diode load structures coupling said diode load structures to a sources of electrical potential.

4. A static RAM cell comprising:
 a first transistor having source and drain regions and a gate electrode;
 a second transistor having source and drain regions and a gate electrode;
 a first polycrystalline silicon diode electrically in series with said second transistor and positioned overlaying and forming a first electrical node with said gate electrode of said first transistor;
 a second polycrystalline silicon diode electrically in series with said first transistor and positioned overlaying and forming a second electrical node with said gate electrode of said second transistor;
 means for coupling said first electrical node to said drain region of said second transistor; and
 means for coupling said second electrical node to said drain region of said first transistor.

5. A static RAM cell having first and second cross coupled transistors and diode loads comprising:
 a first transistor having source and drain regions and a first silicon gate electrode said source region coupled to a first source of electrical potential;
 a second transistor having source and drain regions and a second silicon gate electrode said source region coupled to a first source of electrical potential;
 a first silicon electrode overlaying said first silicon gate electrode and forming a first diode therewith said first silicon electrode coupled to a second source of electrical potential;
 a second silicon electrode overlaying said second silicon gate electrode and forming a second diode therewith, said second silicon electrode coupled to a second source of electrical potential;
 means for cross coupling said first gate electrode and said drain region of said second transistor; and
 means for cros coupling said second gate electrode and said drain region of said first transistor.

* * * * *